United States Patent [19]
Gruenwald et al.

[11] Patent Number: 5,573,808
[45] Date of Patent: Nov. 12, 1996

[54] METHOD FOR PRODUCING A MULTILAYER CIRCUIT

[75] Inventors: Werner Gruenwald, Gerlingen; Walter Roethlingshoefer; Ulrich Goebel, both of Reutlingen; Ralf Haug, Leonberg; Manfred Moser, Reutlingen-Sickenhausen; Annette Seibold, Rutesheim, all of Germany

[73] Assignee: Robert Bosch GmbH, Stuttgart, Germany

[21] Appl. No.: 589,234

[22] Filed: Jan. 22, 1996

[30] Foreign Application Priority Data

Mar. 16, 1995 [DE] Germany ............... 19509554.5

[51] Int. Cl.⁶ ............... B05D 5/12; B41M 3/12
[52] U.S. Cl. ............... 427/79; 427/146; 29/25.42; 156/89; 156/239; 361/321.1
[58] Field of Search ............... 427/79, 146; 29/25.42; 156/89, 239; 269/61; 361/321.1–321.4

[56] References Cited

U.S. PATENT DOCUMENTS

| | | | |
|---|---|---|---|
| 2,390,025 | 11/1945 | Deyrup et al. | 156/239 |
| 3,334,002 | 8/1967 | Heywang | 156/239 |
| 3,470,018 | 9/1969 | Smith et al. | 427/79 |
| 4,753,694 | 6/1988 | Herron et al. | |
| 5,009,794 | 4/1991 | Mandai et al. | 156/89 |
| 5,356,512 | 10/1994 | Hosokawa | 156/89 |
| 5,412,865 | 5/1995 | Takaoka et al. | 156/89 |

FOREIGN PATENT DOCUMENTS

| | | |
|---|---|---|
| 300 186 | 1/1989 | European Pat. Off. |
| 40 33 707 | 4/1992 | Germany |
| 59523 | 12/1986 | Japan |
| 226131 | 9/1989 | Japan |
| 06333774 | 12/1994 | Japan |

OTHER PUBLICATIONS von Mitzarbeit, et al., Gedruckte Schaltungen Technologic und Technik, 1959, pp. 120–121 and 130–131.

Primary Examiner—Shrive Beck
Assistant Examiner—Brian K. Talbot
Attorney, Agent, or Firm—Kenyon & Kenyon

[57] ABSTRACT

In a method for producing a multilayer circuit, it is possible to produce capacitor structures including electrodes and a dielectric arranged in between. By pressing the capacitor structures into a ceramic layer, it is possible to produce a high-quality capacitor inside the multilayer circuit.

4 Claims, 2 Drawing Sheets

METHOD FOR PRODUCING A MULTILAYER CIRCUIT

BACKGROUND INFORMATION

European Patent Application No. EP 300 186 describes a method for producing a multilayer circuit in which a stack of green ceramic sheets is fired. A metal pattern is applied to individual ceramic sheets and then pressed into the green ceramic sheet, The green ceramic sheet is heated in the process in order to soften it.

German Patent Application No. DE 40 33 707 describes a method for producing a resistance element in which a resistive layer and conductor track layers are produced on a carrier using thick-film technology. The structure formed in this way is then pressed into a green flexible ceramic sheet and separated from the carrier.

SUMMARY OF THE INVENTION

The method according to the present invention has the advantage that it is possible to produce high-quality multilayer circuits having incorporated capacitances. At the same time, the mechanical quality of the multilayer circuits is not impaired by the structures for the capacitances. Moreover, the method according to the present invention is simple and can be carried out using, at least in part, well known process steps.

Structures may be produced in a particularly simple manner by screen printing. In this case, it is also possible to use materials which cannot be fired together with the material or the green ceramic sheets. Materials which have already been fired can also be used as a dielectric, which materials permit the production of capacitors having a particularly high quality.

DETAILED DESCRIPTION

Figure 1:
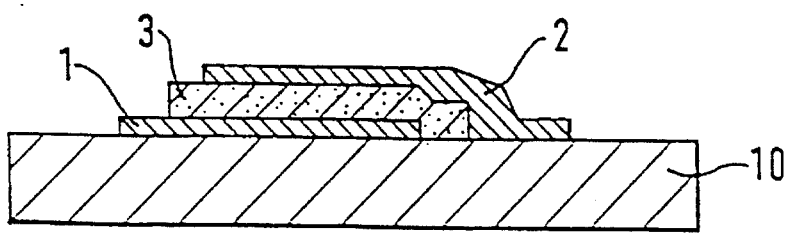
FIG. 1 illustrates a first part of a first exemplary embodiment of the method according to the present invention for producing a capacitor.

FIGS. 1 to 4 show a first exemplary embodiment of the method according to the present invention for producing a multilayer circuit. FIG. 1 shows a carrier 10, on which a first electrode 1 and a second electrode 2 are arranged. A dielectric 3 is provided between the first electrode 1 and the second electrode 2. This structure is produced in a particularly simple manner by firstly printing a structure for the first electrode 1 directly onto the carrier 10 by means of screen printing. A metal-containing paste is used for this, for example. A layer for the dielectric 3 is then printed onto this, use being made for this of a paste which, after a firing step, forms a dielectric layer having a particularly high dielectric constant. As an alternative, it is also possible to apply a ceramic lamina which has already been fired and has a high dielectric constant. An electrically conductive paste for the second electrode 2 is then printed onto this, again by means of screen printing.

The carrier 10 either includes a material to which the printed-on pastes do not adhere very well or, as described in German Patent Application No. DE 40 33 707, is provided with a separating layer.

Figure 2:
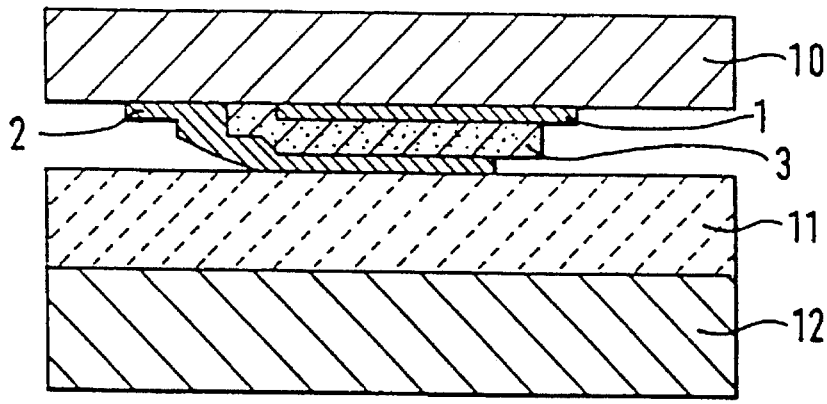
FIG. 2 illustrates a second part of a first exemplary embodiment of the method according to the present invention for producing a capacitor.

FIG. 2 shows how the carrier 10 prepared in this way with the electrodes 1, 2 and the dielectric layer 3 arranged on it is pressed into a green ceramic sheet 11. The ceramic sheet, which may also be heated during the pressing-in operation so that it is sufficiently soft, is arranged on a retaining mount 12 during this operation. By compressing the carrier 10 against the retaining mount 12, the electrodes 1, 2 and the dielectric layer 3 are then pressed into the soft green ceramic sheet 11.

Figure 3:
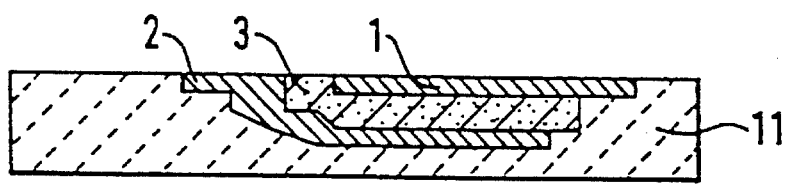
FIG. 3 illustrates a third part of a first exemplary embodiment of the method according to the present invention for producing a capacitor.

FIG. 3 shows the structures which have been pressed in this way into the green ceramic sheet 11, after the carrier 10 and the retaining mount 12 have been removed.

Figure 4:
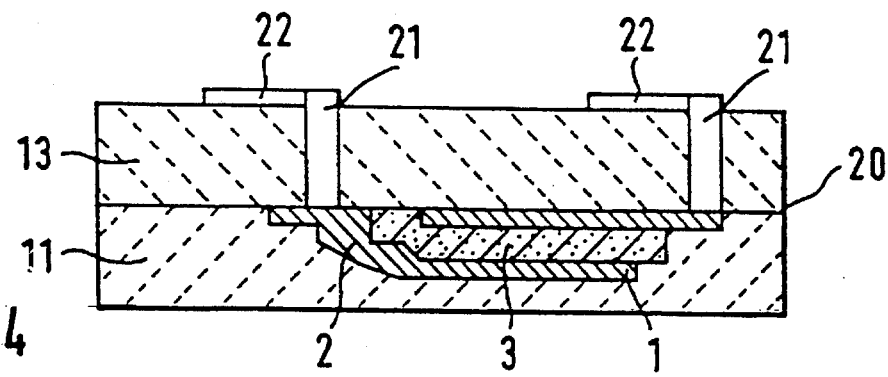
FIG. 4 illustrates a fourth part of a first exemplary embodiment of the method according to the present invention for producing a capacitor.

In a known manner, the green ceramic sheet 11 is then arranged with further green ceramic sheets 13 in a stack and fired to form a multilayer circuit 20. This multilayer circuit 20 is shown in FIG. 4. Plated-through holes 21 and conductor tracks 22 can then be provided in and on the further sheets 13, by means of which plated-through holes and conductor tracks contact is made with the first electrode 1 and the second electrode 2, which can now be arranged inside the multilayer circuit 20.

The multilayer circuit shown in FIG. 4 thus has a capacitor structure inside it, which is formed by the first electrode 1, the second electrode 2 and the dielectric 3 arranged in between. Since the capacitor structure is situated inside the multilayer circuit 20, it has particularly good protection from environmental influences. This is of particular significance if the dielectric 3 is produced by a printed-on paste, since voids frequently remain in such pastes after firing, into which voids gases or atmospheric humidity contained in the ambient air can then penetrate and thus influence the dielectric constant of the material. Furthermore, the dielectric 3 can be applied in particularly thin layers, with the result that large capacitances of the capacitor structure are possible.

Figure 5:
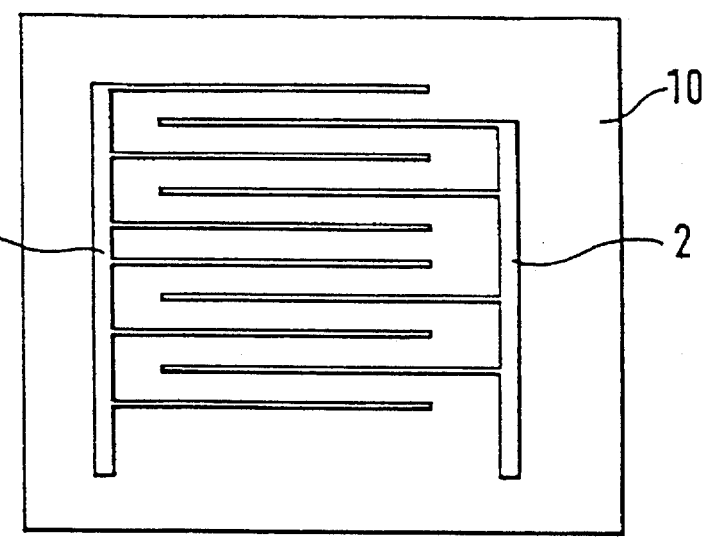
FIG. 5 illustrates a first part of a second exemplary embodiment of the method according to the present invention for producing a capacitor.
Figure 6:
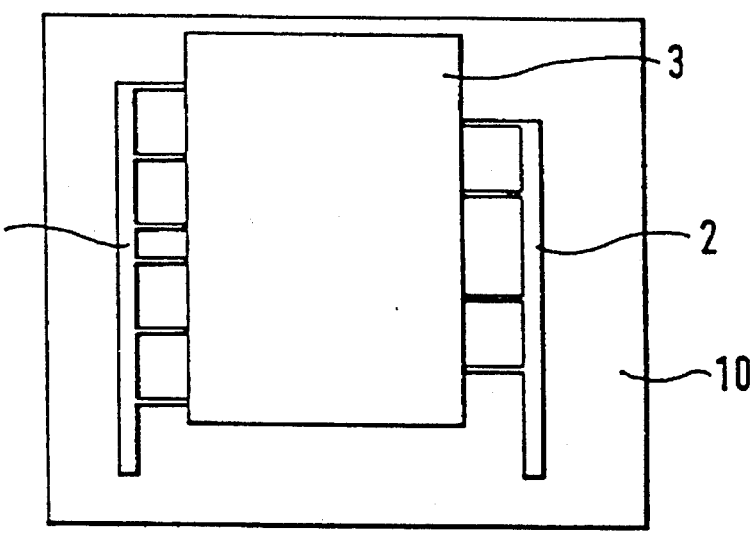
FIG. 6 illustrates a second part of a second exemplary embodiment of the method according to the present invention for producing a capacitor.
Figure 7:
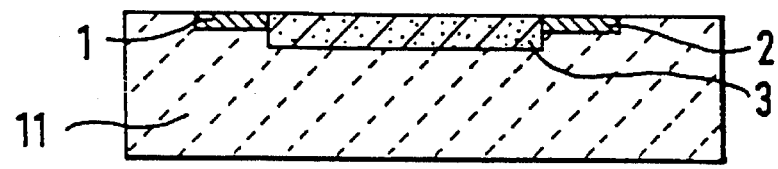
FIG. 7 illustrates a third part of a second exemplary embodiment of the method according to the present invention for producing a capacitor.

The electrodes 1, 2 shown in FIGS. 1 to 4 are constructed as planar electrodes and require a relatively large surface of the green ceramic sheet 11. FIGS. 5, 6 and 7 show a further production method according to the present invention, in which finger structures are used.

FIG. 5 shows a plan view of a carrier 10 onto which there are printed intermeshing finger-like structures for the first electrode 1 underneath the second electrode. These structures can be applied using a single printing step. FIG. 6 then shows a second printing step, in which a paste for the dielectric layer is applied. The structure produced in this way on the carrier 10 is then pressed into a green ceramic sheet, as described above with regard to FIGS. 1 to 3, and the carrier is removed from the electrodes 1, 2 and the dielectric. FIG. 7 shows a cross section of the green ceramic sheet 11 formed in this way with pressed-in electrodes 1, 2 and the dielectric 3. As is evident, the conducting structures for the electrodes 1, 2 are completely embedded in the dielectric 3. If this green ceramic sheet is arranged together with further green ceramic sheets 13 in a stack, there is produced, in a manner analogous to FIG. 4, a multilayer circuit inside which a capacitor of high capacitance is arranged.

The production method according to FIGS. 5 to 7 is simpler than the method according to FIGS. 1 to 4, since the comb-like intermeshing electrodes can be produced using a single printing step.

What is claimed is:

1. A method for producing a multilayer circuit, comprising the steps of:

providing a dielectric arranged between first and second electrodes on a carrier, thereby forming a capacitor;

pressing the capacitor into a first green ceramic sheet;

separating the carrier from the structures after the capacitor is pressed into the first green ceramic sheet; and firing the first green ceramic sheet with a second green ceramic sheet in a stack formation.

2. The method according to claim 1, wherein:

the structures include first and second electrodes; and the first and second electrodes are applied to the carrier by screen printing of a paste.

3. The method according to claim 1, wherein the first and second electrodes are constructed as planar electrodes.

4. The method according to claim 1, wherein the first and second electrodes are constructed as intermeshing finger structures.

* * * * *